US011646498B2

(12) United States Patent
Roth et al.

(10) Patent No.: US 11,646,498 B2
(45) Date of Patent: May 9, 2023

(54) PACKAGE INTEGRATED CAVITY RESONATOR ANTENNA

(71) Applicant: Intel Corporation, Santa Clara, CA (US)

(72) Inventors: Kilian Roth, Munich (DE); Sonja Koller, Lappersdorf (DE); Josef Hagn, Taufkirchen (DE); Andreas Wolter, Regensburg (DE); Andreas Augustin, Munich (DE)

(73) Assignee: Intel Corporation, Santa Clara, CA (US)

( * ) Notice: Subject to any disclaimer, the term of this patent is extended or adjusted under 35 U.S.C. 154(b) by 843 days.

(21) Appl. No.: 16/414,356

(22) Filed: May 16, 2019

(65) Prior Publication Data

US 2020/0365996 A1 Nov. 19, 2020

(51) Int. Cl.

| | |
|---|---|
| ***H01L 23/34*** | (2006.01) |
| ***H01Q 13/18*** | (2006.01) |
| ***H01L 23/66*** | (2006.01) |
| ***H01L 23/528*** | (2006.01) |
| ***H01L 23/31*** | (2006.01) |
| ***H01L 21/56*** | (2006.01) |
| ***H01L 21/48*** | (2006.01) |
| ***H01L 23/498*** | (2006.01) |
| ***H01Q 1/22*** | (2006.01) |

(52) U.S. Cl.

CPC ......... *H01Q 13/18* (2013.01); *H01L 21/4853* (2013.01); *H01L 21/56* (2013.01); *H01L 23/3128* (2013.01); *H01L 23/49816* (2013.01); *H01L 23/528* (2013.01); *H01L 23/66* (2013.01); *H01Q 1/2283* (2013.01); *H01L 2223/6616* (2013.01); *H01L 2223/6677* (2013.01)

(58) Field of Classification Search

CPC ...... H01Q 13/18; H01Q 1/2283; H01L 23/66; H01L 2223/6616; H01L 2223/6677

USPC .......................................................... 257/728

See application file for complete search history.

(56) References Cited

U.S. PATENT DOCUMENTS

2012/0119969 A1* 5/2012 MacDonald ............ H01L 23/66 343/841

2018/0205134 A1* 7/2018 Khan .................... H01Q 5/314

(Continued)

*Primary Examiner* — Nitin Parekh

(74) *Attorney, Agent, or Firm* — Schwabe, Williamson & Wyatt, P.C.

(57) ABSTRACT

Embodiments include semiconductor packages and methods of forming the semiconductor packages. A semiconductor package includes a die over a substrate, a first conductive layer over the die, and a cavity resonator antenna over the first conductive layer and substrate. The cavity resonator antenna includes a conductive cavity, a cavity region, and a plurality of interconnects. The conductive cavity is over the first conductive layer and surrounds the cavity region. The semiconductor package also includes a second conductive layer over the cavity resonator antenna, first conductive layer, and substrate. The conductive cavity may extend vertically from the first conductive layer to the second conductive layer. The cavity region may be embedded with the conductive cavity, the first conductive layer, and the second conductive layer. The plurality of interconnects may include first, second, and third interconnects. The first interconnects may include through-mold vias (TMVs), through-silicon vias (TSVs), conductive sidewalls, or conductive trenches.

16 Claims, 8 Drawing Sheets

100
A A'
127 107 117 126 130 125 129 111 131 112 129
140 120 113
106 102 105
135

100
130 140 131 129
A 113 A'
112
127
126 125 111 117

(56) References Cited

U.S. PATENT DOCUMENTS

2019/0103680 A1* 4/2019 Liao .................. H01Q 21/0087
2019/0115643 A1* 4/2019 Khan ....................... H01Q 9/42
2019/0280368 A1* 9/2019 Khan ................... H01Q 1/2283
2020/0035625 A1* 1/2020 Wang .................. H01L 23/3135
2020/0105687 A1* 4/2020 Wang .................... H01L 21/565
2020/0243441 A1* 7/2020 Hsiao .................. H01L 23/5283

* cited by examiner 300
307
306
302
305

300
A
A'
313
312
340
317
311
325
326
327

PACKAGE INTEGRATED CAVITY RESONATOR ANTENNA

FIELD

Embodiments relate to packaging semiconductor devices. More particularly, the embodiments relate to semiconductor devices with substrates that have cavity resonator antennas.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down these ICs while optimizing the performance of each device, however, is not without issue.

As the number of antennas and the amount of data throughput for wireless and sensor applications steadily increases, existing packaging technologies need antenna solutions to save space and substantially increase efficiency and communication performances. Antennas are implemented into printed circuit boards (PCBs) or the housings of wireless devices. These antennas, however, typically increase the footprint and/or the z-height of the PCBs and devices, and include high losses due to the distances between the antennas and the ICs, which thereby results in reduced overall efficiency. Additionally, these losses are also scaled with the carrier frequency of the antennas/communication system, which thereby results in increased losses as the carrier frequency increases.

BRIEF DESCRIPTION OF THE DRAWINGS

Embodiments described herein are illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
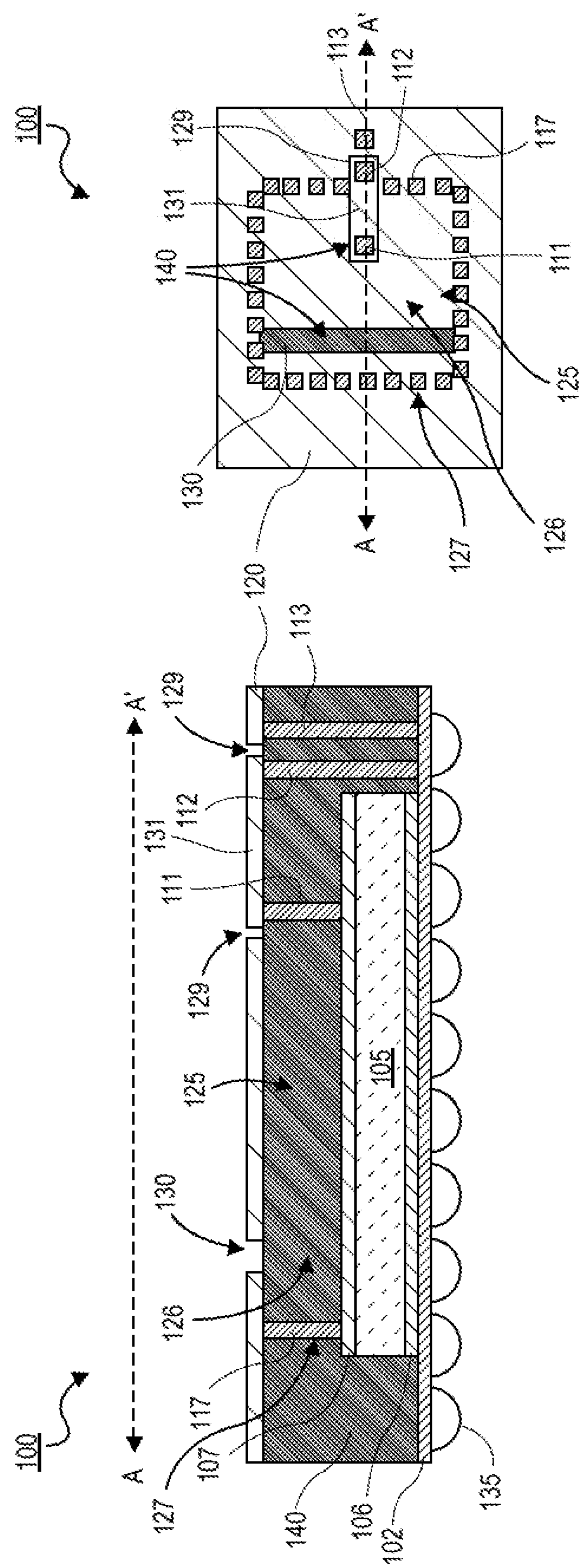
FIG. 1 are illustrations of a cross-sectional view and the respective plan view of a semiconductor package having a cavity resonator antenna, an encapsulation layer, a first conductive layer, a second conductive layer, and a substrate, according to one embodiment.

Described herein are semiconductor devices (or semiconductor packages) with substrates that include cavity resonator antennas and methods of forming such semiconductor packages. The semiconductor packages described below and methods of forming such semiconductor packages (e.g., wafer level chip scale packages (WLCSPs), flip-chip packages (FCPs), etc.) having a substrate with a die, an encapsulation layer (or a dielectric layer, a mold layer, etc.), and an antenna (e.g., a cavity resonator antenna or the like), in some embodiments. Furthermore, the antenna may be implemented with a conductive/metallized cavity disposed over a top surface of the die (or a die backside) and located on the topside of the substrate, where the conductive cavity may include a conductive lid with a slot, and where a standing electromagnetic wave may be excited (e.g., with inductive/capacitive coupling) and radiated through the slot providing directed emissions of the electromagnetic wave(s), according to one embodiment As described herein, a "cavity resonator antenna" may refer to an antenna having a conductive cavity, a cavity region, and a plurality of interconnects that is disposed over a conductive layer (or a first conductive layer) of a semiconductor package (e.g., a WLCSP, a FCP, or the like), where the conductive cavity is disposed over the conductive layer, where a conductive lid (or a second conductive layer) is disposed over the conductive cavity to embed the cavity region, and where the conductive lid may have a slot that radiates (or directs/emits) an exited standing wave. Such standing wave may be excited with a signal from a die and routed inside the conductive cavity with one or more signal interconnects, where the signal interconnects are coupled to the conductive lid and/or a connection point (or a short coplanar waveguide, a signal trace, a feedline connection point (or a feed line slot), a patch based launcher, and/or any other millimeter wave (mm-wave) signal launching/connector structures) patterned into the conductive lid. Note that, since antennas are reciprocal communication devices, the antennas described herein may radiate/transmit signals, and the same functionality of the antennas may be implicitly included to receive signals. Also, note that the semiconductor packages described herein may include a plurality of conductive cavity resonators (or a cavity resonator antenna array) disposed over the conductive layer, where such antenna array may include one or more coupled antennas that are substantially similar to the cavity resonator antenna described herein, according to one embodiment.

Additionally, as described herein, a "conductive cavity" may refer to a conductive enclosure (or a metallized enclosure/cage/box/etc.) having a top wall, a bottom wall, and a plurality of sidewalls, where the top wall may include a surface of the conductive lid, where the bottom wall may include a surface of the conductive layer, and where the plurality of sidewalls may include a plurality of first interconnects (e.g., the first interconnects of the sidewalls may include a plurality of through-mold vias (TMVs), a plurality of through-silicon vias (TSVs), a plurality of conductive sidewalls, a plurality of conductive trenches, and/or a combination thereof). The conductive cavity may be filled (or disposed) with an encapsulation layer, a dielectric layer, and/or air in the cavity. The conductive cavity described herein does not have to be a fully enclosed enclosure and may be an open-ended enclosure with one or more open/exposed walls or sides.

As described above, antennas and data throughput for wireless and sensor applications/devices are increasing which leads to packages with increased form factors and heightened losses due to the distances between the antennas and the integrated circuits. To overcome these problems (and many other problems) and provide improvements in these environments (or other related environments), the semiconductor packages described herein implement integrated cavity resonator antennas to reduce space consumption, and to improve efficiency as the distance (or losses) between the antenna element and the transceiver front-end (or the active layer) is substantially minimized.

Other advantages of the embodiments of the integrated cavity resonator antennas include:

(i) Implementing such antennas with the ever-shrinking sensors (e.g., proximity sensors) and mobile devices that are severely limited in package/board space. For example, due to the high power density of the transmission with larger antenna arrays at mm-wave, sensing the proximity of human body parts (or other objects) is necessary and thus reducing the transmitting power when such sensors are triggered is also vital. With such procedures, the skin tissue heating above the defined requirement may be prevented with these proximity sensors. Such sensors may be implemented (or formed) with additional antennas (e.g., similar to antennas used to obtain short-range distance measurements in cars), which may also lead to mobile devices (or other receivers) needing additional antennas. Accordingly, as the space available for such functionalities is severely limited, these sensors and mobile devices require implementing additional antennas such as the cavity resonator antennas described below in FIGS. 1-2, which avoid increasing the overall form-factor of such packages and adding problems and/or design complexities.

(ii) Enabling devices with future highly integrated terahertz applications (e.g., in the range of approximately 0.1 to 0.3 THz) to include even-more antennas on a single package. Dependent on the frequency range and the desired antenna pattern, future applications/devices may even integrate an antenna array on the package. For example, the wavelength at 60 GHz is roughly 5 mm. This may enable a 2 mm×2 mm antenna array to be integrated with the package even with an area of approximately 5 mm×5 mm. Accordingly, as the wavelength scales linearly with the carrier frequency, future highly integrated terahertz applications (or the like) may integrate even-more antennas on semiconductor packages by using the cavity resonator antennas described below in FIGS. 1-2.

(iii) Mitigating signal losses as the distance of the feed lines are minimized. For example, existing technologies require (or desire) that the connection from the power amplifier to the antenna be as short as possible, especially given that, for a high frequency signal, relatively short connections already result in a major attenuation of the signal. Likewise, as every attenuation before the low-noise amplifier (LNA) typically has a direct impact on the noise figure of the overall receiver, this is also the case for the signal reception as the connection from the LNA to the antenna requires shorter distances. Accordingly, these signal losses may be substantially reduced (or mitigated) with the cavity resonator antennas described below in FIGS. 1-2 as the distance of the feed lines are minimized by disposing such antennas directly on the transceiver chip of the package chip.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems (e.g., such systems also include base stations, routers, and so on), cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages (e.g., WLCSPs, FCPs, or the like) having substrates that are integrated with cavity resonator antennas.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms “top,” “bottom,” “upper,” “lower,” “lowermost,” and “uppermost” when used in relationship to one or more elements are intended to convey a relative rather than absolute physical configuration. Thus, an element described as an “uppermost element” or a “top element” in a device may instead form the “lowermost element” or “bottom element” in the device when the device is inverted. Similarly, an element described as the “lowermost element” or “bottom element” in the device may instead form the “uppermost element” or “top element” in the device when the device is inverted.

FIG. 1 is a cross-sectional view and the respective plan view of a semiconductor package 100 as illustrated on the A-A' axis, according to one embodiment. In some embodiments, FIG. 1 illustrates one of the approaches that enables integrating the cavity resonator antenna 125 over a substrate 102 of the semiconductor package 100. Note that, as described herein, the cavity resonator antenna 125 may be referred to in-part (or interchangeably) as a cavity resonator, a conductive cavity, a metallized enclosure (or box/cage), or the like.

In these embodiments described below, the cavity resonator antenna 125 may be implemented with a plurality of TMVs 117 (or a plurality of first interconnects, a TMV cage, etc.) that are tightly disposed on/over the outer periphery/ edges of a first conductive layer 107 (or a die backside metallization layer) to form the one or more sidewalls of the conductive cavity 127. Additionally, as shown in FIG. 1, a first conductive layer 107 may be implemented as a bottom wall, and a second conductive layer 120 (or a conductive lid) may be implemented as a top wall, where the combination of these walls (i.e., the sidewalls, the top wall, and the bottom wall) may respectively implement (or dispose/form) a conductive cavity 127 and a cavity region 126 of the cavity resonator antenna 125. Note that, as described above, the sidewalls of the conductive cavity 127 may include TMV sidewalls, TSV sidewalls, conductive/metallized sidewalls, conductive/metallized trenches, and/or a combination thereof. In some embodiments, to excite a standing wave, the cavity resonator antenna 125 may route a signal inside the conductive cavity 127 from a die 105 (or a transceiver front-end die) to a connection point 131 using two signal TMVs 111-112, where the signal TMVs 111-112 are conductively coupled to the connection point 131 (i.e., the connection point 131 may be a feedline slot, a signal trace patterned into the second conductive layer 120, a coplanar waveguide based connector, and/or the like) that is disposed/patterned into the second conductive layer 120.

Referring now to FIG. 1, a cross-sectional view and the respective plan view of a semiconductor package 100 is shown, in accordance with an embodiment. The semiconductor package 100 may include a cavity resonator antenna 125 that is disposed over a die 105 and a substrate 102, where the cavity resonator antenna 125 may include a conductive cavity 127, a cavity region 126, and a plurality of interconnects 111-113 and 117. In one embodiment, the semiconductor package 100 may be a FCP, WLCSP, a wirebond encapsulated package, and/or the like. For one embodiment, the substrate 102 may include, but is not limited to, a package substrate, a printed circuit board (PCB), and a motherboard. The substrate 102 may be a layer(s) of dielectric and/or conductive materials as is known in the art. In another embodiment, the substrate 102 may be a layer of dielectric material. In other embodiments, the substrate 102 may be a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 102 may also include one or more conductive layers that may include copper or metallic traces, lines, pads, vias, via pads, and/or planes.

In one embodiment, an active layer 106 may be disposed between the die 105 and the substrate 102, where the substrate 102 may be coupled to a plurality of solder balls 135 (or a plurality of conductive bumps, pads, studs/pillars, semi-balls, gullwings, etc.) that may be used to couple the substrate 102 to another substrate. The active layer 106 may be an active region, a redistribution layer comprised of conductive interconnects (or bumps), an active conductive layer, or the like. In an alternate embodiment, the active layer 106 may be a die attach material or the like, where the die attach material may be implemented with, for example, a wirebond package or the like. In an embodiment, the die 105 may be implemented as a transceiver front-end die. For some embodiments, the die 105 may be a microelectronic device, a semiconductor die, an integrated circuit (IC), a central processing unit (CPU), a microprocessor, a platform controller hub (PCH), a memory, and/or a field-programmable gate array (FPGA). Additionally, a first conductive layer 107 may be disposed on a top surface (or a backside) of the die 105. The first conductive layer 107 may be a die backside metallization layer. In an alternative embodiment, the first conductive layer 107 may be disposed over and substantially parallel to the die backside metallization layer, where the first conductive layer 107 may be separated from the die backside metallization layer by a mold or dielectric layer.

Furthermore, as shown in FIG. 1, an encapsulation layer 140 may be disposed over the first conductive layer 107, the die 105, the active layer 106, and the substrate 102. The encapsulation layer 140 may surround a plurality of TMVs 117, one or more signal TMVs 111-112, and one or more ground TMVs 113, where the cavity region 126 of the conductive cavity 127 may be filled (completely or partially) with the encapsulation layer 140 (i.e., the cavity region 126 may be filled completely or partially with a mold layer, a dielectric layer, air, and/or the like). In one embodiment, the encapsulation layer 140 may be a mold layer and/or any similar encapsulation/molding material(s). For one embodiment, the encapsulation layer 140 may include an epoxy (e.g., a soft epoxy, a stiff epoxy, opaque epoxy, etc.) with one or more filler materials. In alternate embodiments, one or more portions of the encapsulation layer 140 may be replaced with other dielectric material (i.e., the encapsulation layer 140 may be combined with other portions of dielectric material rather than a uniform layer of molding materials). In an embodiment, the encapsulation layer 140 may be compression molded, laminated, planarized, or the like. For example, the encapsulation layer 140 may have a top surface that is substantially coplanar to the top surfaces of the TMVs 117, the signal TMVs 111-112, and the ground TMV 113.

For one embodiment, the TMVs 117 and 111-113 may be copper interconnects, copper pillars, and/or any similar conductive via interconnects. In some embodiments, the TMVs 117 and 113 may be a plurality of ground TMVs, where each of these vias may be grounded. Whereas the TMVs 111-112 may be a plurality signal TMVs, where each of these vias may be used to route signals. In one embodiment, the TMVs 117 may have a width (or a diameter) that is substantially equal to a width of the signal and ground TMVs 111-113. In alternate embodiments, the TMVs 117 may have a width (or a diameter) that is different than a width of the signal and ground TMVs 111-113. Additionally, for one embodiment, the signal TMV 111 may have a thickness that is less than a thickness of the signal TMV 112, where the thickness of the signal TMV 111 may be approximately equal to a thickness of the TMVs 117, while the thickness of the signal TMV 112 may be approximately equal to a thickness of the ground TMV 113.

In one embodiment, the sidewalls of the conductive cavity 127 (or the conductive cage) may be implemented with TMV sidewalls. While, in another embodiment, the sidewalls of the conductive cavity 127 may be implemented with a combination of TMV sidewalls, TSV sidewalls, and/or conductive walls/trenches. As shown with the illustrations of FIG. 1, when the sidewalls of the conductive cavity 127 are TMV sidewalls, each of the TMVs 117 may be tightly placed/located adjacent to each other and disposed on the first conductive layer 107 to form the sidewalls (or edges) of the conductive cavity 127 of the cavity resonator antenna 125. These tightly located TMVs 117 may have small gaps formed between the TMVs 117. The small gaps may be filled with the encapsulation layer 140, where the encapsulation layer 140 is thus disposed between each pair of the TMVs 117.

Additionally, in one embodiment, the first conductive layer 107 may be implemented as the bottom wall of the conductive cavity 127 of the cavity resonator antenna 125. In an embodiment, a second conductive layer 120 may be disposed over the encapsulation layer 140, the TMVs 117, and the signal and ground TMVs 111-113. As such, the second conductive layer 120 is disposed over the TMVs 117 (i.e., the sidewalls of the conductive cavity 127) to form the conductive lid (or a metal lid) of the cavity resonator antenna 125.

In some embodiments, the conductive cavity 127 of the cavity resonator antenna 125 may have a specified dimension(s) (x, y, and z values) based on the desired packaging design and/or applications. The dimension(s) of the conductive cavity 127 may include a length in the lateral direction that may defined by half the wavelength of such antenna (λ/2), and a thickness (or a depth) in the z-height direction that may be approximately 100 μm or greater, where the thickness (or the cavity depth) may be limited by the bandwidth of such antenna. In other embodiments, the cavity region 126 of the conductive cavity 127 may have a thickness of approximately 20-100 μm based on specified applications that may be operating at narrower bands (e.g., such specified (or alternate/special) applications may include proximity sensing). In one embodiment, the cavity region 126 may have a thickness of approximately 20 um to 0.5 mm, where the thickness of the cavity region 126 may be based on the desired mold thickness and bandwidth of the cavity resonator antenna 125. In another embodiment, the cavity region 126 may have a thickness of approximately 100 um to 5 mm.

Additionally, the cavity region 126 of the conductive cavity 127 may have a footprint defined by an x-y area of such cavity region 126 based on the desired wavelength(s) of the cavity resonator antenna 125. The cavity region 126 may have an antenna length (x) that may be approximately equal to half of the desired wavelength. The cavity region 126 may have an antenna length (y) that may be approximately equal to or less than half of the desired wavelength. Note that the tolerance ranges of the footprint may vary by roughly +/−50%, but such footprint may be greater if desired. For example, for mobile packaging, the cavity region 126 of the conductive cavity 127 may have a footprint (or an x-y) of approximately 0.2 mm to 1 cm. Whereas, for larger packages, the cavity region 126 of the conductive cavity 127 (may have a footprint (or an x-y) of approximately 0.2 mm to 10 cm, according to another embodiment.

Furthermore, in alternate embodiments, two or more cavity resonator antennas may be implemented together into one package as a cavity resonator antenna array by disposing such antennas adjacently to each other (or side-by-side) over the conductive layer and the substrate. Note that these two or more antennas may be disposed side-by-side when the footprint (or the area) of a first conductive layer and a die (or the die backside metallization) are large enough to accommodate both of these antennas. In other alternate embodiments, the sidewalls of the conductive cavity of the cavity resonator antenna may be alternatively implemented with filled trenches in the encapsulation layer, where the trenches may be formed by etching or laser-grooving one or more openings (or portions/trenches) in the encapsulation layer and then respectively sputtering/plating/printing a conductive material into the openings (or the non-filled portions) to form the sidewalls of the conductive cavity of the cavity resonator antenna.

Moreover, in other alternate embodiments, the cavity resonator antenna may include a non-filled (or unfilled) cavity region (i.e., not filled with the encapsulation layer). For example, the non-filled cavity region may be implemented by mounting a pre-casted/molded lid (or a metallic tape) over the non-filled cavity region, which may be implemented by under-etching the second conductive layer, and/or by selectively etching of a temporary encapsulation layer such as temporary molding materials. Note that, however, the under-etching process may not be needed when the second conductive layer (or the conductive lid) is implemented, for example, as a separate component/part that may be disposed over the antenna after the formation of the conductive cavity and cavity region. Furthermore, in additional embodiments, the semiconductor packages described herein may implement a thin or ultra-thin conductive cavity (or a conductive cavity with a substantially low thickness/depth) to form the cavity resonator antenna, where the conductive cavity may be disposed into the topside of such packages (e.g., the thin conductive cavity may be disposed onto the topmost backside tape of the substrate of such packages).

In some embodiments, as shown in both views of FIG. 1, the cavity resonator antenna 125 may include a slot 130 and a connection point 131 implemented by patterning one or more openings 129 into/through the second conductive layer 120 to expose the cavity region 126 of the conductive cavity 127. For one embodiment, the slot 130 may be disposed (or formed) directly over and within the cavity region 126 of the conductive cavity 127, while a portion of the connection point 131 may be disposed over the cavity region 126, and the other portion of the connection point 131 may be disposed over an outer region that is located outside the conductive cavity 127. For example, the connection point 131 may be surrounded with an opening 129 patterned into the second conductive layer 120, where the connection point 131 has a first edge and a second edge that is opposite to the first edge, where the first edge may be positioned over the cavity region 126, and the second edge may be positioned outside the cavity region 126, and where the connection point 131 may be conductively coupled to the second interconnects 111-112.

In an embodiment, the slot 130 may be implemented as a slot to emit electromagnetic (EM) waves such as standing waves (or the like). The slot 130 may receive an excited standing wave (or an EM signal) and output the standing wave. For some embodiments, the slot 130 has a length (or long side) that may be between approximately 50-100% of the desired footprint (or x-y area) of the cavity region 126 of the conductive cavity 127, and a width (or short side) that may be between approximately 1-30% of the desired footprint of the cavity region 126 of the conductive cavity 127. In another embodiment, the connection point 131 may be a signal trace implemented as a patch waveguide based launcher that is coplanar to the second conductive layer 120. As such, a standing wave may be excited with a signal from the die 105 and routed within/inside the conductive cavity 127 of the cavity resonator antenna 125 via one or more of the signal TMVs 111-112, where the top portion/surface of the one or more signal TMVs 111-112 are coupled to the connection point 131. Alternatively, in one embodiment, the semiconductor package may implement different paths to route the signal and to excite the standing waves into the cavity region of the conductive cavity of the cavity resonator antenna. For example, a combination of a signal through silicon via (TSV) and a signal TMV may be implemented to route and excite the signal by directing the signal via the combination of the TMV and the TSV to the conductive lid, where the TSV may be disposed through the transceiver front-end die and the cavity region, and extend vertically from the transceiver front-end die to the conductive lid.

Note that the semiconductor package 100 may include fewer or additional or alternative packaging components based on the desired packaging design.

Figure 2:
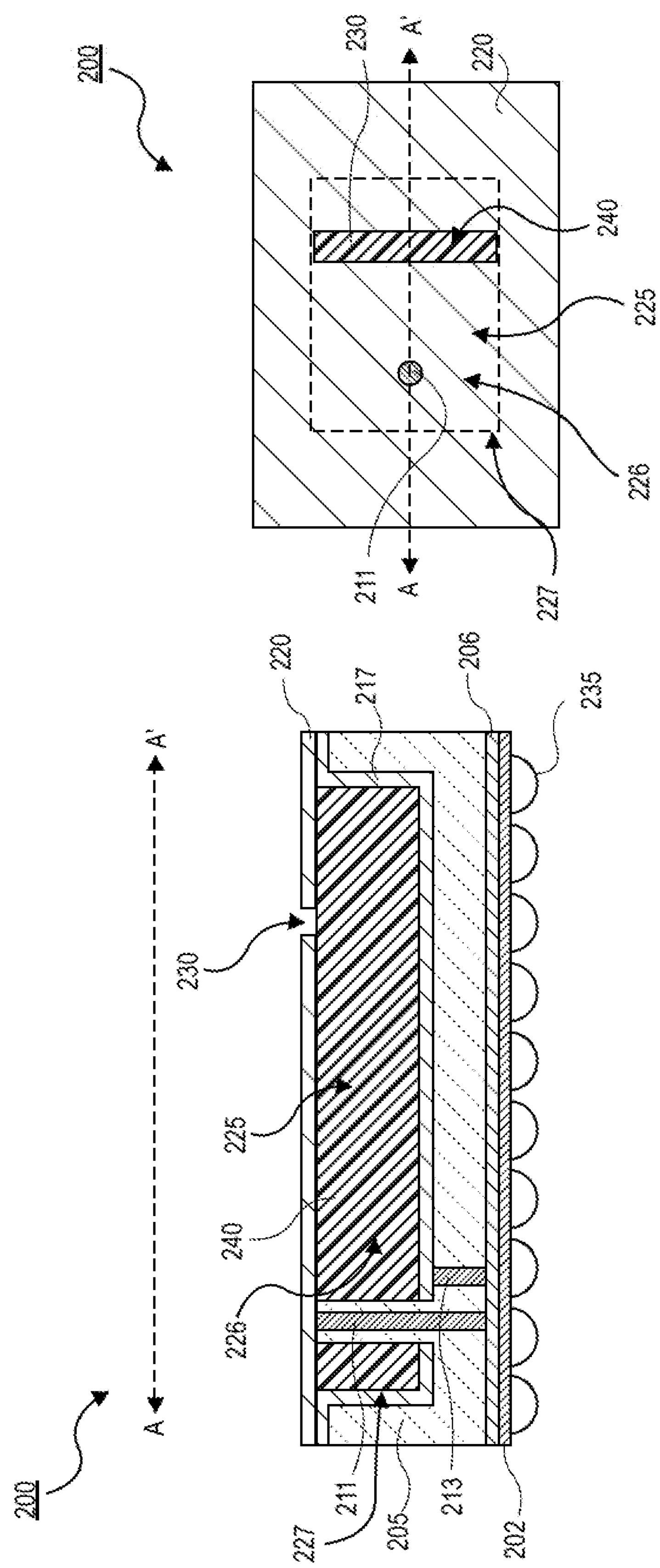
FIG. 2 are illustrations of a cross-sectional view and the respective plan view of a semiconductor package having a cavity resonator antenna, a first dielectric layer, a second dielectric layer, a first conductive layer, a second conductive layer, and a substrate, according to one embodiment.

FIG. 2 is a cross-sectional view and the respective plan view of a semiconductor package 200 as illustrated on the A-A' axis, according to one embodiment. The semiconductor package 200 may be similar to the semiconductor package 100 described above in FIG. 1, with the exception that the cavity resonator antenna 225 is filled with a second dielectric layer 240 as compared to an encapsulation/mold layer, and disposed over a first dielectric layer 205 (e.g., a bulk silicon layer or the like) as compared to a die (i.e., the cavity resonator antenna 225 is formed over the bulk silicon wafer). In some embodiments, FIG. 2 illustrates one of the approaches that enables integrating the cavity resonator antenna 225 over a wafer substrate, such as a substrate 202 (or a substrate) of the semiconductor package 200.

Referring now to FIG. 2, a cross-sectional view and the respective plan view of a semiconductor package 200 is shown, in accordance with an embodiment. The semiconductor package 200 may be a WLCSP that has been singulated (or diced)—at the wafer level—from a plurality of other WLCSPs contained within a wafer. For example, the wafer may be any suitable type of wafer such as a bulk silicon wafer, a silicon-on-insulator (SOI) wafer, an engineered substrate formed of one or more semiconductor materials (e.g., crystalline silicon, amorphous silicon, polysilicon, etc.), and/or the like. In addition, for some embodiments, the wafer may be full or ground down to a predetermined substrate thickness.

In some embodiments, the semiconductor package 200 may include a cavity resonator antenna 225 disposed over a first dielectric layer 205, an active layer 206, and a substrate 202. The semiconductor package 200 may be a WLCSP, a FCP, a wirebond encapsulated package, and/or the like. The cavity resonator antenna 225 may be substantially similar to the cavity resonator antenna 125 described above in FIG. 1. As described above, the cavity resonator antenna 225 may include a conductive cavity 227, a cavity region 226, and a plurality of interconnects 211 and 213. In one embodiment, the cavity resonator antenna 225 may be disposed in between a first conductive layer 217 and a second conductive layer 220 that are coupled on the topside of the semiconductor package 200 to form the conductive cavity 227, in which the standing waves may be excited by, e.g., inductive/capacitive coupling. In these embodiments, the conductive cavity 227 may surround (or embed) the cavity region 226 that may be filled (completely or partially) with a second dielectric layer 240 (i.e., the cavity region 226 may be filled completely or partially with a mold layer, a dielectric layer, air, and/or the like).

In some embodiments, the first conductive layer 217 may be patterned and disposed in the shape of a conductive enclosure with a bottom wall and a plurality of sidewalls; and the second conductive layer 220 may be disposed over the patterned conductive enclosure of the first conductive layer 217 as a conductive lid to form the conductive cavity 227 and the cavity region 226 of the cavity resonator antenna 225. Accordingly, in one embodiment, the sidewalls of the conductive cavity 227 (or the conductive cage) may be implemented with the conductive sidewalls of the first conductive layer 217. While, in another embodiment, the sidewalls of the conductive cavity 227 may be implemented with a combination of TMV sidewalls, TSV sidewalls, and/or conductive walls/trenches. That is, as described above in some embodiments, the sidewalls of the conductive cavity 227 may include TMV sidewalls, TSV sidewalls, conductive/metallized sidewalls, conductive/metallized trenches, and/or a combination thereof.

As described above, the cavity resonator antenna 225 may have a slot 230 that may be patterned into (or through) the second conductive layer 220 to emit (or supply/direct) the EM waves. This includes emitting standing waves that may be excited via a signal TSV 211 that is coupled to the second conductive layer 220, which may be implemented as a grounded lid. For some embodiments, the slot 230 has a length (or long side) that may be between approximately 50-100% of the desired footprint (or x-y area) of the cavity region 226 of the conductive cavity 227, and a width (or short side) that may be between approximately 1-30% of the desired footprint of the cavity region 226 of the conductive cavity 227. In one embodiment, a standing wave may be excited with a signal from the active layer 206 and routed within/inside the cavity region 226 of the conductive cavity 227 via the signal TSV 211, where the top portion/surface of the signal TSV 211 is coupled to the second conductive layer 220 that may be grounded.

In some embodiments, the signal TSV 211 may be coupled to the active layer 206 and the second conductive layer 220, while a ground TSV 213 may be coupled to the active layer 206 and the first conductive layer 217, and may be disposed adjacent to the signal TSV 211. For one embodiment, the signal and ground TSVs 211 and 213 may be copper interconnects, copper pillars, and/or any similar conductive via interconnects. In one embodiment, the signal TSV 211 may have a width that is substantially equal to a width of the ground TSV 213. In alternate embodiments, the TSV 211 may have a width that is different than a width of the ground TSV 213. Additionally, for one embodiment, the signal TSV 211 may have a thickness that is greater than a thickness of the ground TSV 213.

In an embodiment, the TSV 211 may extend vertically from the active layer 206 to the second conductive layer 220, and through the second dielectric layer 240 in the cavity region 226 of the conductive cavity 227, where the TSV 211 may be surrounded by the first dielectric layer 205. The first dielectric layer 205 may be a bulk silicon layer or the like, while the second dielectric layer 240 may include a dielectric filler material/layer, an encapsulation layer, air, and/or the like. Note that, in these embodiments, the second dielectric layer 240 may include a dielectric filler material with a low relative permittivity to achieve a signal with a larger (or greater) bandwidth if desired.

For one embodiment, the first dielectric layer 205 may be disposed over the active layer 206 and the substrate 202, where the active layer 206 is disposed directly over the substrate 202. In one embodiment, the substrate 202 may include, but is not limited to, a package substrate, a PCB, and a motherboard. The substrate 202 may be a layer(s) of dielectric and/or conductive materials as is known in the art (e.g., the substrate 202 may be a redistribution layer or the like). In another embodiment, the substrate 202 may be a layer of dielectric material. In other embodiments, the substrate 202 may be a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB may also include one or more conductive layers that may include copper or metallic traces, lines, pads, vias, via pads, and/or planes. In one embodiment, the substrate 202 may be coupled to a plurality of solder balls 235 that may be used to couple the substrate 202 to another substrate.

Furthermore, as shown in FIG. 2, the first conductive layer 217 may be disposed over the top surface of the dielectric layer 205 and the active layer 206, where the first conductive layer 217 may be implemented as the cavity region 226 of the conductive cavity 227. For one embodiment, the active layer 206 may be an active region, a redistribution layer comprised of conductive interconnects (or bumps), an active conductive layer, or the like. In an embodiment, the active layer 206 may be implemented as a transceiver front-end layer. Accordingly, the cavity region 226 of the first conductive layer 217 may be positioned over the bulk silicon layer 205 at the periphery of the die region.

In one embodiment, the second dielectric layer 240 may be disposed over the first conductive layer 217, the first dielectric layer 205, the active layer 206, and the substrate 202. The second dielectric layer 240 may surround the signal TSV 211 and may fill the cavity region 226 of the conductive cavity 227. For example, the second dielectric layer 240 may have a top surface that is substantially coplanar to the top surface of the TSV 211 and the topmost surface of the first conductive layer 217 (i.e., the topmost surface of the first conductive layer 217 may be located at the top edges of the conductive cavity 227, where both the first conductive layer 217 and the second conductive layer 220 are directly disposed on and coupled to each other). In one embodiment, the second dielectric layer 240 may be a dielectric with one or more filler materials. For some embodiments, the second dielectric layer 240 may be a high-k dielectric, a low-k dielectric, and/or air.

For some embodiments, the second dielectric layer 240 may include one or more dielectric materials having a high-Dk dielectric, such as elements include hafnium, silicon, oxygen, titanium, tantalum, lanthanum, aluminum, zirconium, barium, strontium, yttrium, lead, scandium, niobium, and/or zinc. As used herein, a "high-k dielectric" refers to a material having a higher dielectric constant (k) than silicon oxide, where the terms "oxide," "carbide," "nitride," etc. refer to compounds containing, respectively, oxygen, carbon, nitrogen, etc. Examples of high-k materials that may be used in the second dielectric layer 240 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate.

In other embodiments, the second dielectric layer 240 may be formed using dielectric materials having low-Dk dielectric materials. Examples of such dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and/or organosilicates, such as silsesquioxane, siloxane, or organosilicate glass. For some embodiments, the second dielectric layer 240 may include pores, air gaps, or air regions/portions to further reduce such dielectric constant.

In some embodiments, the conductive cavity 227 of the cavity resonator antenna 225 may have a specified dimension(s) (x, y, and z values) based on the desired packaging design and/or applications. The dimension(s) of the conductive cavity 227 may include a length in the lateral direction that may defined by half the wavelength of such antenna ($\lambda/2$), and a thickness (or a depth) in the z-height direction that may be approximately 100 μm or greater, where the thickness (or the cavity depth) may be limited by the bandwidth of such antenna. In other embodiments, the cavity region 226 of the conductive cavity 227 may have a thickness of approximately 20-100 μm based on specified applications that may be operating at narrower bands (e.g., such specified (or alternate/special) applications may include proximity sensing). In one embodiment, the cavity region 226 may have a thickness of approximately 20 um to 1 mm, where the thickness of the cavity region 226 may be based on the desired dielectric filler thickness and bandwidth of the cavity resonator antenna 225. In another embodiment, the cavity region 226 may have a thickness of approximately 100 um to 5 mm.

Additionally, the cavity region 226 of the conductive cavity 227 may have a footprint defined by an x-y area of such cavity region 226 based on the desired wavelength(s) of the cavity resonator antenna 225. The cavity region 226 may have an antenna length (x) that may be approximately equal to half of the desired wavelength. The cavity region 226 may have an antenna length (y) that may be approximately equal to or less than half of the desired wavelength. Note that the tolerance ranges of the footprint may vary by roughly +/−50%, but such footprint may be greater if desired. For example, for mobile packaging, the cavity region 226 of the conductive cavity 227 may have a footprint (or an x-y) of approximately 0.2 mm to 1 cm. Whereas, for larger packages, the cavity region 226 of the conductive cavity 227 (may have a footprint (or an x-y) of approximately 0.2 mm to 10 cm, according to another embodiment.

Furthermore, in alternate embodiments, two or more cavity resonator antennas may be implemented together into one package as a cavity resonator antenna array by disposing such antennas adjacently to each other (or side-by-side) over the conductive layer and the substrate. Note that these two or more antennas may be disposed side-by-side when the footprint (or the area) of a first conductive layer and/or a die area/periphery are large enough to accommodate both of these antennas. Moreover, in other alternate embodiments, the cavity resonator antenna may include a non-filled (or unfilled) cavity region (i.e., not filled with the second dielectric layer). For example, the non-filled cavity region may be implemented by mounting a pre-casted/molded lid (or a metallic tape) over the non-filled cavity region, which may be implemented by under-etching the second conductive layer, and/or by selectively etching of a temporary encapsulation layer such as temporary molding materials. Note that, however, the under-etching process may not be needed when the second conductive layer (or the conductive lid) is implemented, for example, as a separate component/part that may be disposed over the antenna after the formation of the conductive cavity and cavity region.

Alternatively, in an embodiment, the semiconductor package may implement different paths to route the signal and to excite the standing waves into the cavity region of the conductive cavity of the cavity resonator antenna. For example, in this alternate embodiment, a through via (or a through-filler via, a through-silicon via, a through-cavity via, or the like) may be implemented through the second dielectric layer 240 in the cavity region 226 of the conductive cavity 227 to route the signal and to excite the standing wave, where the through via may extend vertically from the first conductive layer 217 to the second conductive layer 220, where the through via may either be not in electrical contact with the first conductive layer 217 or be coupled to a pad (or the like) disposed in/on the first conductive layer 217 that is isolated from the ground plane and respectively coupled to the signal TSV 211, and where this signal TSV 211 may only extend vertically from the active layer 206 to the pad of the first conductive layer 217 (i.e., rather than the signal TSV described above which extends vertically from the active layer 206 to the second conductive layer 220).

Furthermore, in additional embodiments, the semiconductor packages described herein may implement a thin or ultra-thin conductive cavity (or a conductive cavity with a substantially low thickness/depth) to form the cavity resonator antenna, where the conductive cavity may be disposed into the topside of such packages (e.g., the thin conductive cavity may be disposed onto the topmost backside tape of the substrate of such packages).

Note that the semiconductor package 200 may include fewer or additional or alternative packaging components based on the desired packaging design.

FIGS. 3A-3E are illustrations of cross-sectional views and respective plan views of a process flow to form a semiconductor package 300 with a cavity resonator antenna 325, according to some embodiments. The process flow illustrated in FIGS. 3A-3E forms the semiconductor package 300 which is substantially similar to the semiconductor package 100 described above in FIG. 1. Accordingly, as described above, the process flow of semiconductor package 300 illustrates one of the approaches to integrate the cavity resonator antenna 325 over a die 305 and a substrate 302 by implementing a plurality of TMVs 317, a first conductive layer 307, and a second conductive layer 320 over the die 305 and the substrate 302 to form a conductive cavity 327 and a cavity region 326 of the cavity resonator antenna 325, according to some embodiments.

Figures 3A, 3B:
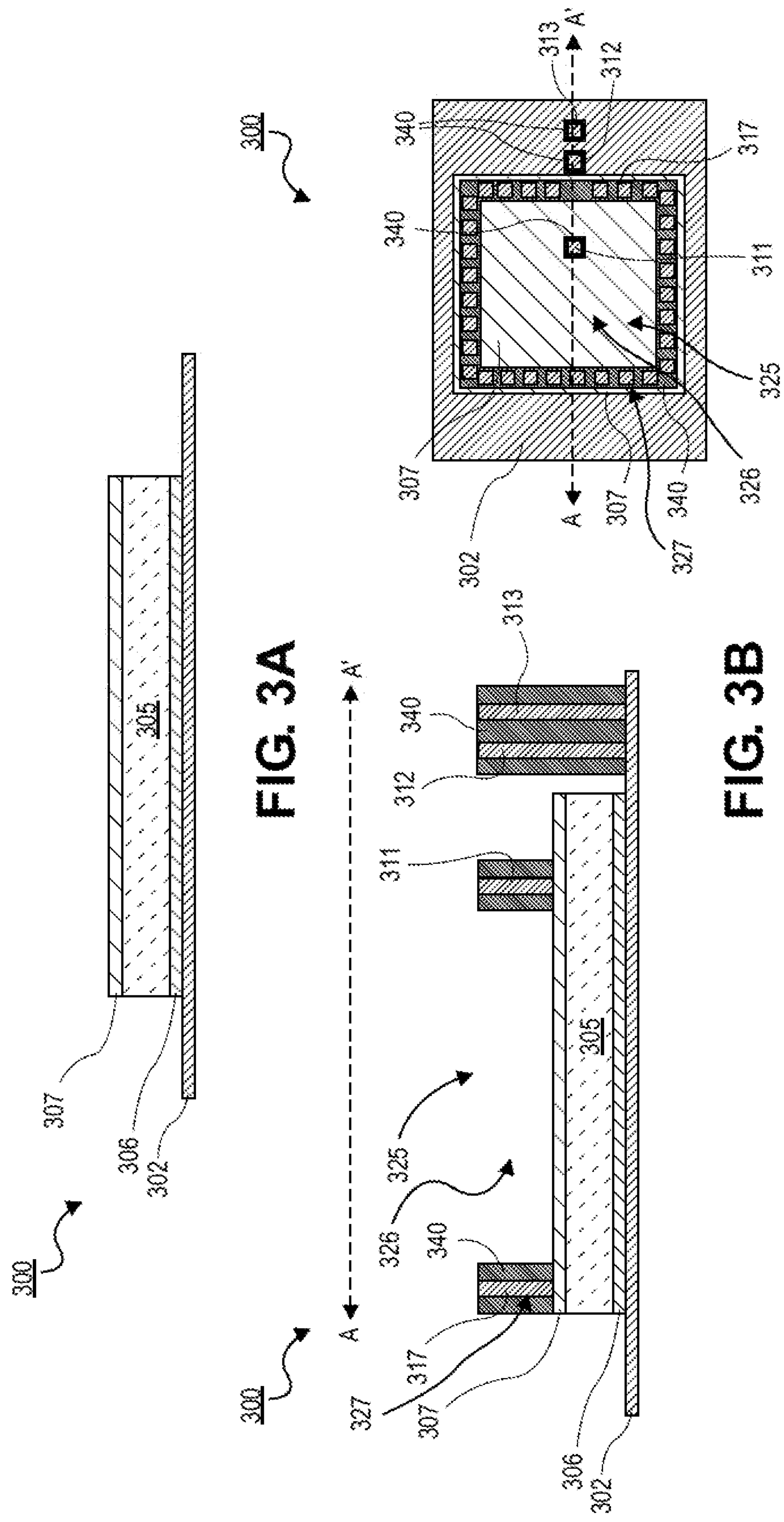
FIGS. 3A-3E are illustrations of cross-sectional views and respective plan views of a process flow to form a semiconductor package having a cavity resonator antenna, an encapsulation layer, a first conductive layer, a second conductive layer, and a substrate, according to some embodiments.

Referring now to FIG. 3A, a cross-sectional illustration of a semiconductor package 300 is shown, in accordance with an embodiment. In an embodiment, the semiconductor package 300 may include a die 305 disposed over an active layer 306 and a substrate 302, where the active layer 306 couples the substrate 302 to the die 305. The substrate 302, the die 305, and the active layer 306 are substantially similar to the substrate 102, the die 105, and the active layer 106 described above in FIG. 1. The active layer 306 may include a plurality of conductive bumps (or interconnects). In an alternate embodiment, the active layer 306 may be a die attach material or the like, where the die attach material may be implemented with, for example, a wirebond package or the like. For one embodiment, a first conductive layer 307 may be disposed over the top surface of the die 305.

Alternatively, in other embodiments, the semiconductor package 300 may be a wirebond package or the like. For example, in these alternative embodiments, the semiconductor package 300 may include a die (e.g., the die 305) disposed below an active layer (e.g., the active layer 306) and a substrate (e.g., the substrate 302), where the active layer may include a plurality of signal pads, and where a plurality of interconnects such as wirebonds or the like may be coupled from the substrate to the die and/or the active layer. Additionally, in this alternative embodiment, a first conductive layer (e.g., the first conductive layer 307) may be subsequently disposed over a top surface of the active layer, where such surface (or portion/region) of the active layer has no signal pads.

Referring now to FIG. 3B, a cross-sectional illustration and the respective plan illustration of a semiconductor package 300 on the A-A' axis is shown, in accordance with an embodiment. In an embodiment, the semiconductor package 300 may include a cavity resonator antenna 325 disposed over the first conductive layer 307, where the cavity resonator antenna 325 may include a conductive cavity 327, a cavity region, and a plurality of interconnects 311-313 and 317. The cavity resonator 325 with a conductive cavity 327, a cavity region 326, and a plurality of interconnects 311-313 and 317 may be substantially similar to the conductive cavity 127, the cavity region 126, and the plurality of interconnects 111-113 and 117 described above in FIG. 1. In one embodiment, the interconnects of the cavity resonator antenna 325 may include a plurality of TMVs 317, one or more signal TMVs 311-312, and one or more ground TMVs 313. As shown in FIG. 3B, these TMVs 317 and 311-313 may be pre-encapsulated (or pre-molded) with an encapsulation layer 340, where the encapsulation layer 340 may surround each of the TMVs 317 and 311-313. The TMVs 317 and 311-313 are substantially similar to the TMVs 117 and 111-113 described above in FIG. 1. Note that, as described above, the conductive cavity 327 may be implemented with TMV sidewalls (e.g., such as the TMVs 317), TSV sidewalls, and/or conductive walls/trenches.

Additionally, in one embodiment, the TMVs 317 and the signal TMV 311 may be disposed directly over the first conductive layer 307, where the TMVs 317 are tightly positioned next to each other and above the first conductive layer 307 to form a conductive cavity 327 with a cavity region 326 (or an encaged cavity region). For some embodiments, the TMV 312 and the ground TMV 313 may be positioned adjacently to each other and disposed directly over the substrate 302. As shown with the top-view of FIG. 3B, the conductive cavity 327 may have the TMVs 317 and the cavity region 326 surround the signal TMV 311, while the signal TMV 312 and the ground TMV 313 may be positioned outside the cavity region 326 of the conductive cavity 327. In one embodiment, the TMVs 317 and 311-313 with the encapsulation layer 340 may be implemented with a pick-and-place process or the like. In another embodiment, the TMVs 317 and 311-313 may be implemented with a lithographical process, a laser-drilled process, or the like, where the encapsulation layer 340 is initially disposed (or overmolded) over the substrate 302 and then the respective TMVs are implemented (or formed).

Figure 3C:
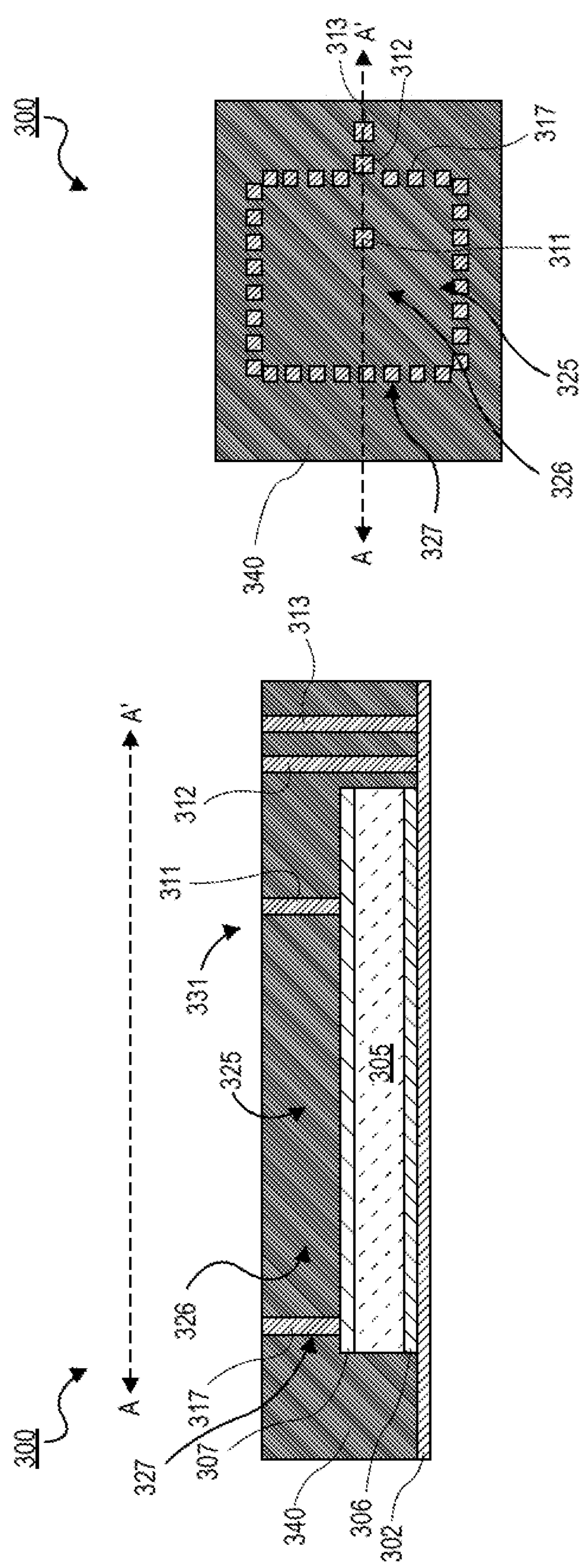

Referring now to FIG. 3C, a cross-sectional illustration and the respective plan illustration of a semiconductor package 300 on the A-A' axis is shown, in accordance with an embodiment. In an embodiment, the semiconductor package 300 may include the encapsulation layer 340. The encapsulation layer 340 may be disposed (or deposited) over the TMVs 317 and 311-313, the first conductive layer 307, the die 305, the active layer 306, and the substrate 302, where after the over-molding of the encapsulation layer 340 the cavity region 326 of the cavity resonator antenna 325 may be filled or partially filled. In one embodiment, the encapsulation layer 340 may be implemented (overmolded) with a molding process or the like. Additionally, in another embodiment, the encapsulation layer 340 may be planarized with a polishing/grinding process or the like as the encapsulation layer 340 may thus have a top surface that is substantially coplanar to the top surfaces of the TMVs 317 and 311-313. The encapsulation layer 340 may be substantially similar to the encapsulation layer 140 described above in FIG. 1.

Figure 3D:
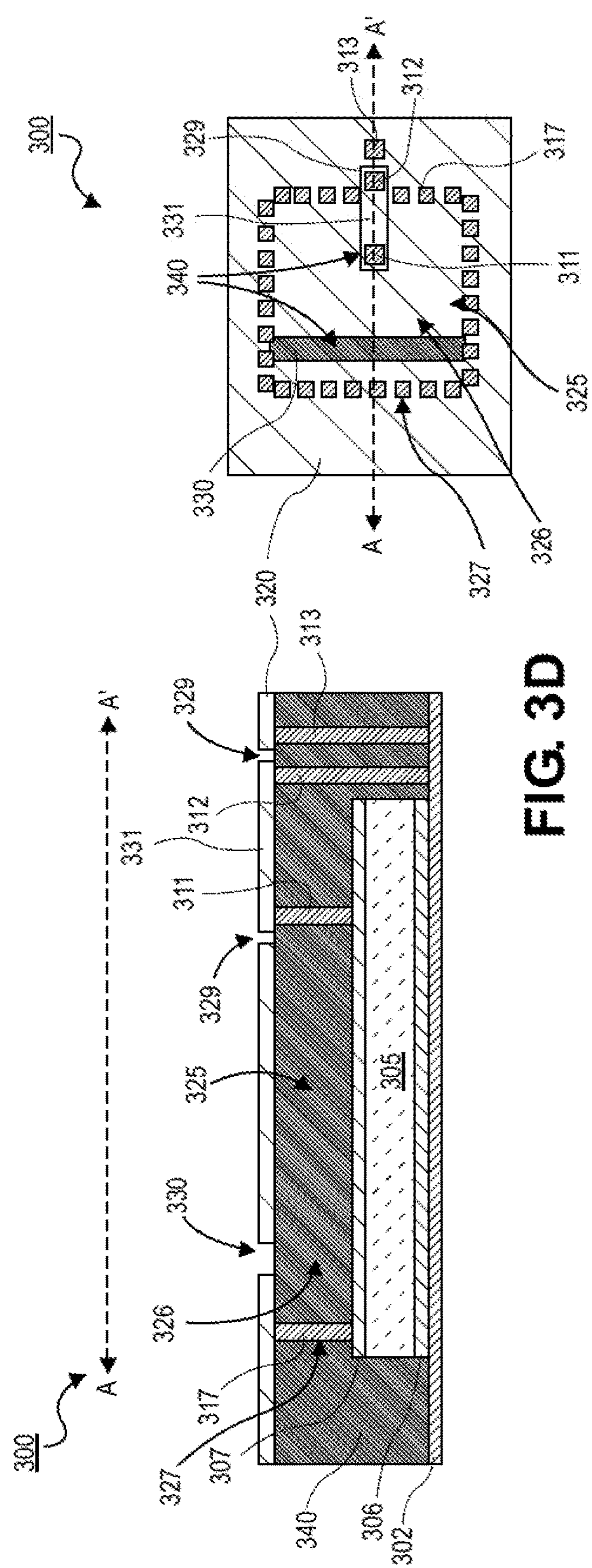

Referring now to FIG. 3D, a cross-sectional illustration and the respective plan illustration of a semiconductor package 300 on the A-A' axis is shown, in accordance with an embodiment. In an embodiment, the semiconductor package 300 may include a second conductive layer 320 disposed over the encapsulation layer 340, the TMVs 317 and 311-

313, and the cavity region 326 of the conductivity cavity 327 of the cavity resonator antenna 325. The second conductive layer 320 may be coupled to the top surfaces of the TMVs 317 and 311-313, where an opening 329 may be patterned into the second conductive layer 320 as a connection point 331 to ensure isolation of the signal vias 311 and 312 from the grounded vias such as the TMVs 317 and the ground TMV 313.

Accordingly, the second conductive layer 320 may be coupled to the top surfaces of the TMVs 317 and may thus be implemented as the conductive lid (or top wall) of the conductive cavity 327 of the cavity resonator antenna 325. In some embodiments, the cavity resonator antenna 325 may include a slot 330 and the connection point 331, where one or more openings 329 may be patterned into (or through) the second conductive layer 320 to form the slot 330 and the connection point 331. The slot 330 and the connection point 331 are substantially similar to the slot 130 and the connection point 131 described above in FIG. 1. For example, the connection point 331 may be a feedline slot, a signal trace, a coplanar waveguide based connector, and/or the like that is patterned into the second conductive layer 320 and coupled to the signal TMVs 311-312 to excite standing wave(s). The slot 330 may be implemented into the conductive cavity 327 of the cavity resonator antenna 325 to receive and emit the standing wave(s). Accordingly, in some embodiments, the second conductive layer 320 may be implemented with a sputtering process or the like, whereas the opening 329 (and/or the opening of the slot 330) may be implemented with a patterned mask during the sputtering process. The second conductive layer 320 may be substantially similar to the second conductive layer 120 described above in FIG. 1.

Figure 3E:
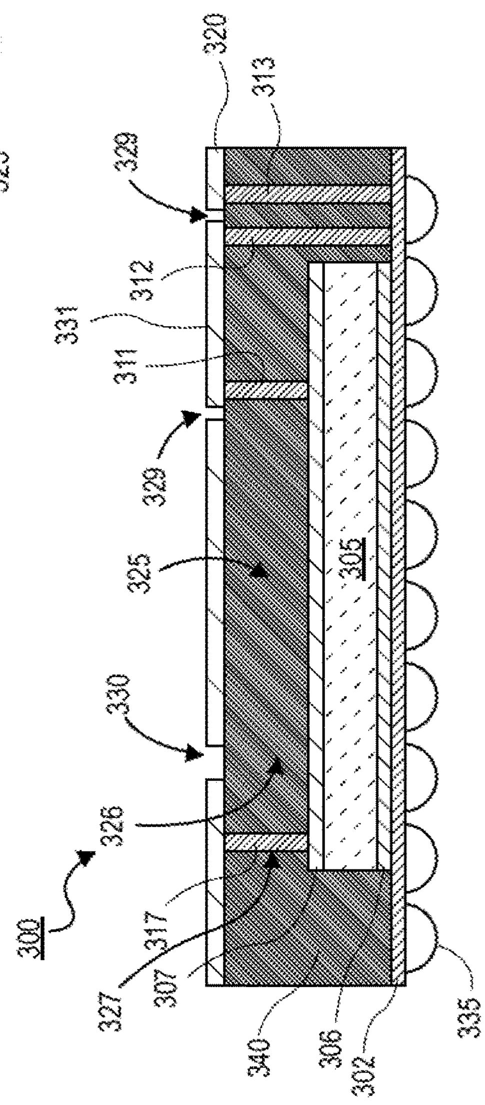

Referring now to FIG. 3E, a cross-sectional illustration of a semiconductor package 300 is shown, in accordance with an embodiment. In an embodiment, the semiconductor package 300 may include a plurality of solder balls 335. The solder balls 335 may be coupled to the substrate 302. Additionally, after the solder balls 335 are disposed, the semiconductor package 300 may be singulated.

Note that the semiconductor package 300 of FIGS. 3A-3E may include fewer or additional or alternative packaging components based on the desired packaging design.

FIGS. 4A-4F are illustrations of cross-sectional views of a process flow to form a semiconductor package 400 with a cavity resonator antenna 425, according to some embodiments. The process flow illustrated in FIGS. 4A-4F forms the semiconductor package 400 that may be substantially similar to the semiconductor package 200 described above in FIG. 2. Accordingly, as described above, the process flow of semiconductor package 400 illustrates one of the approaches to integrate the cavity resonator antenna 425 over a substrate 402 by implementing a first conductive layer 417, a second dielectric layer 440, and a second conductive layer 420 to form a conductive cavity 427 and a cavity region 426 of the cavity resonator antenna 425, according to one embodiment. In these embodiments, the process flow may also illustrate one of the approaches that enables integrating the cavity resonator antenna 425 over a bulk silicon wafer substrate (or the like) that may be subsequently singulated to form the semiconductor package 400 (e.g., a WLCSP).

Figure 4A:
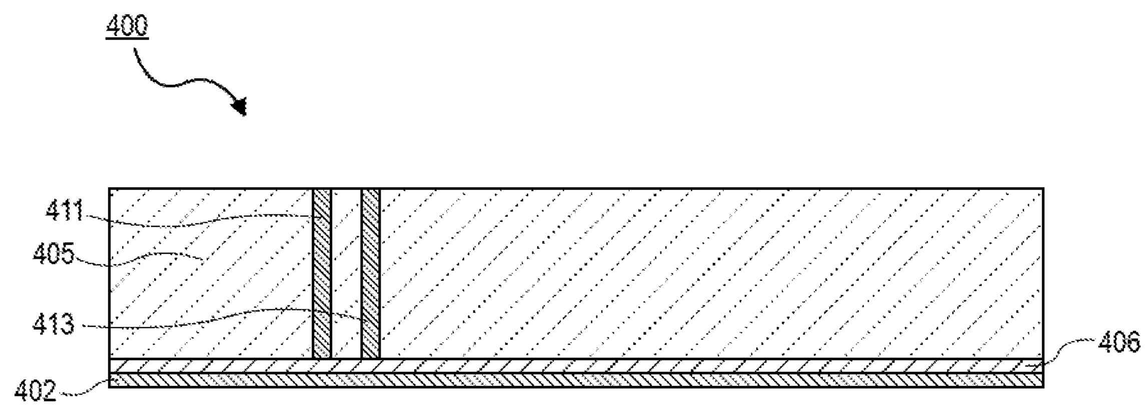
FIGS. 4A-4F are illustrations of cross-sectional views of a process flow to form a semiconductor package having a cavity resonator antenna, a first dielectric layer, a second dielectric layer, a first conductive layer, a second conductive layer, and a substrate, according to some embodiments.

Referring now to FIG. 4A, a cross-sectional illustration of a semiconductor package 400 is shown, in accordance with an embodiment. In an embodiment, the semiconductor package 400 may include a first dielectric layer 405 disposed over an active layer 406 and a substrate 402. For one embodiment, a plurality of TSVs 411 and 413 are disposed through the first dielectric layer 405 and extend vertically on the active layer 406, where the first dielectric layer 405 may have a top surface that is substantially coplanar to top surfaces of the TSVs 411 and 413. The substrate 402, the first dielectric layer 405, the TSVs 411 and 413, and the active layer 406 are substantially similar to the substrate 202, the first dielectric layer 205, the TSVs 211 and 213, and the active layer 206 described above in FIG. 2. The active layer 406 may be implemented as a transceiver front-end that is coupled to the signal TSV 411 and the ground TSV 413, where the signal TSV 411 may be used to excite the standing waves, and the ground TSV 413 may be coupled to ground.

Figure 4B:
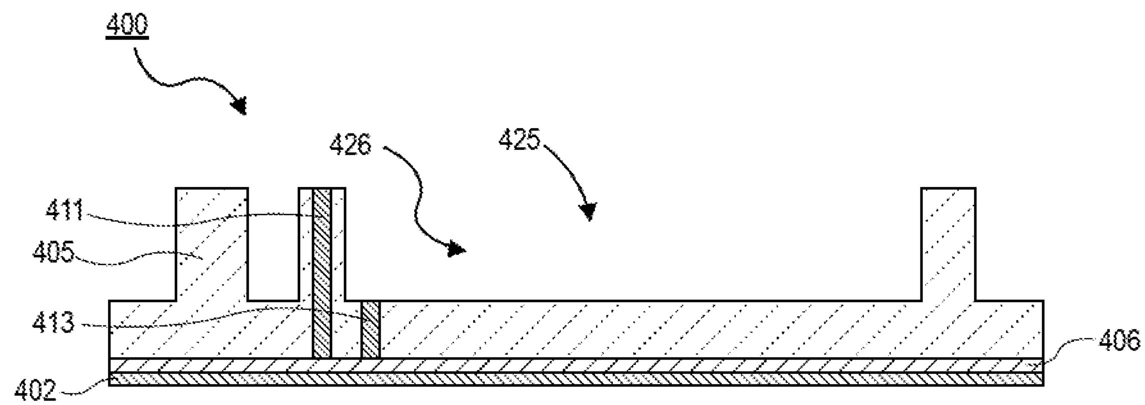

Referring now to FIG. 4B, a cross-sectional illustration of a semiconductor package 400 is shown, in accordance with an embodiment. In an embodiment, the semiconductor package 400 may include patterning the first dielectric layer 405 to form a cavity region 426 (or a plurality of openings) of the cavity resonator antenna 425 into the first dielectric layer 405. For one embodiment, the cavity resonator antenna 425 may implement the cavity region 426 to surround the signal TSV 411. For one embodiment, the cavity region 426 and the other openings may be masked-etched cavities/openings, where the first dielectric layer 405 (or the bulk silicon layer) at the die periphery and around the TSVs 411 and 413 remains. Additionally, the ground TSV 413 may be etched to include a top surface that is substantially coplanar to a bottom surface of the cavity region 426. In one embodiment, the cavity region 426 and the other openings may be implemented with a reactive-ion etching process or the like.

Figure 4C:
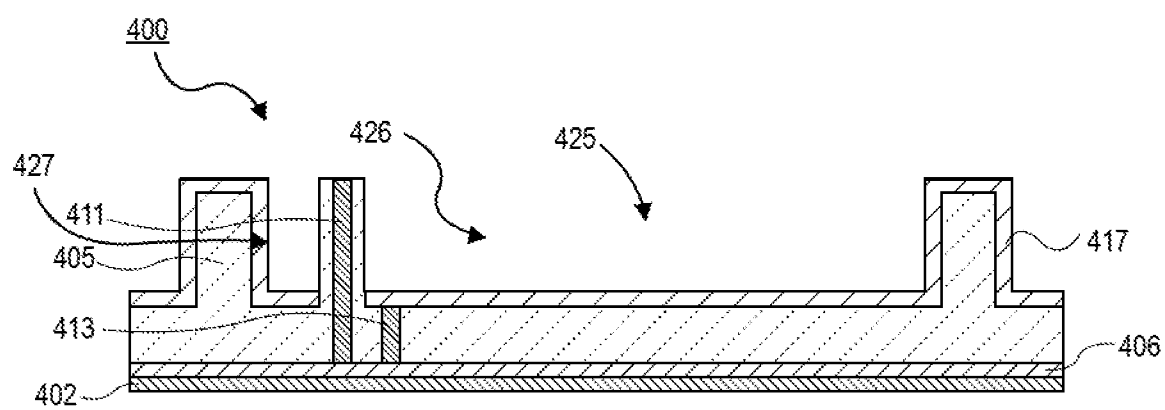

Referring now to FIG. 4C, a cross-sectional illustration of a semiconductor package 400 is shown, in accordance with an embodiment. In an embodiment, the semiconductor package 400 may include a first conductive layer 417. The first conductive layer 417 may be disposed over the first dielectric layer 405, the TSV 413, and the cavity region 426, where the signal TSV 411 remains isolated and surrounded with the first dielectric layer 405, and thus not coupled to the first conductive layer 417. The first conductive layer 417 may be substantially similar to the first conductive layer 217 described above in FIG. 2. In one embodiment, as described above, the first conductive layer 417 may be patterned with the cavity region 426 to form a conductive cavity 427 of the cavity resonator antenna 425, where the conductive cavity 427 may thus be implemented as the conductive enclosure/cage with a bottom wall and a plurality of sidewalls of the cavity resonator antenna 425. Furthermore, the first conductive layer 417 may be directly coupled to a top surface of the ground TSV 413, and may include a top surface that is substantially coplanar to a top surface of the signal TSV 411, where the sidewall(s) and top surface of the signal TSV 411 may remain isolated as the signal TSV 411 is surrounded (or embedded/covered) with the first dielectric layer 405 and thus not coupled to the first conductive layer 417.

Figure 4D:
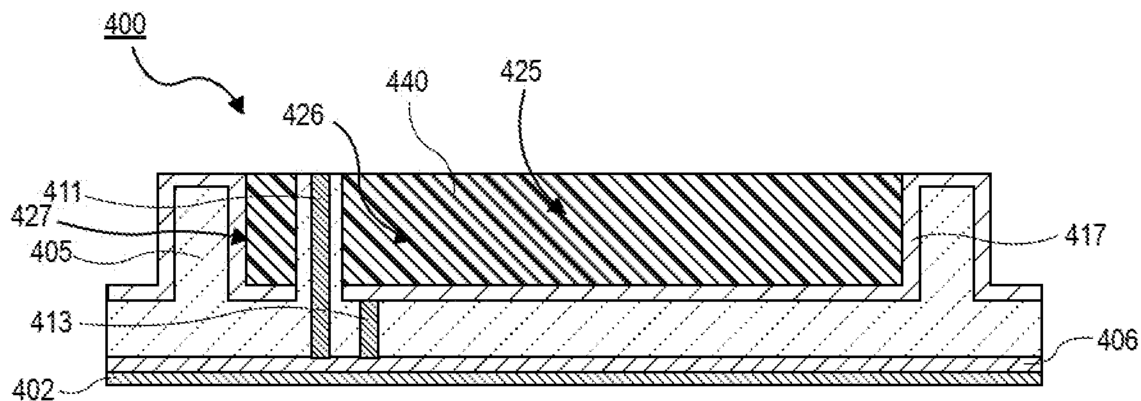

Referring now to FIG. 4D, a cross-sectional illustration of a semiconductor package 400 is shown, in accordance with an embodiment. In an embodiment, the semiconductor package 400 may include a second dielectric layer 440. The second dielectric layer 440 may be disposed over the cavity region 426 of the conductive cavity 427, where the second dielectric layer 440 may surround the signal TSV 411 that remains isolated and surrounded with the first dielectric layer 405. The second dielectric layer 440 may be substantially similar to the second dielectric layer 240 described above in FIG. 2. In one embodiment, the second dielectric layer 440 may have a top surface that is substantially coplanar to the top surfaces of the first conductive layer 417, the first dielectric layer 405, and the signal TSV 411. As shown in FIG. 4D, after disposing the second dielectric layer 440, the cavity region 426 of the conductive cavity 427 may be filled/embedded (completely or partially) with the second dielectric layer 440. In one embodiment, the second dielectric layer 440 may be implemented with a filler dispensing process, a three-dimensional (3D) or screen printing, or the like.

Figure 4E:
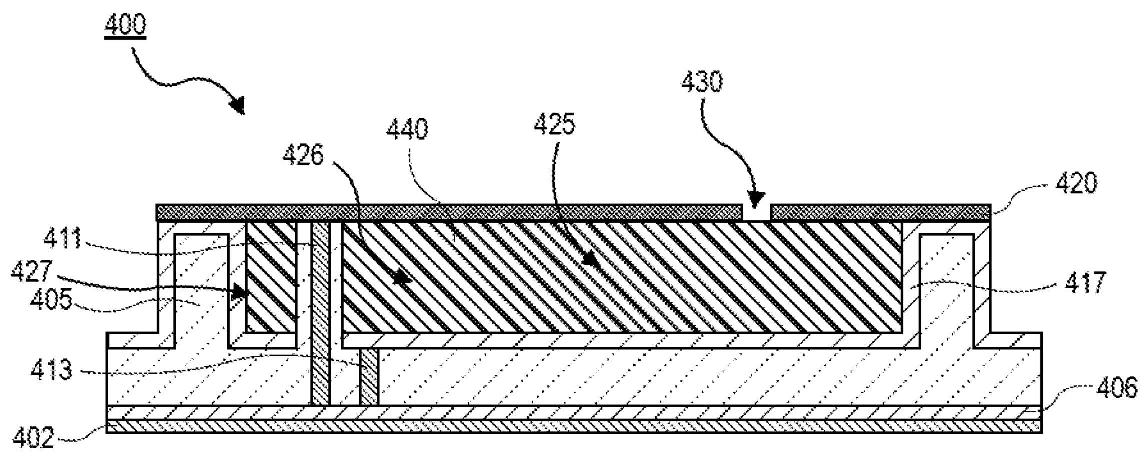

Referring now to FIG. 4E, a cross-sectional illustration of a semiconductor package 400 is shown, in accordance with an embodiment. In an embodiment, the semiconductor package 400 may include a second conductive layer 420 disposed over the second dielectric layer 440, the signal TSV 411 surrounded with the first dielectric layer 405, and the first conductive layer 417. The second conductive layer 420 may be substantially similar to the second conductive layer 220 described above in FIG. 2. In one embodiment, the second conductive layer 420 may be coupled to the top surfaces of the signal TSV 411 and the first conductive layer 417, and may thus be implemented as the conductive lid (or the top wall) of the conductive cavity 427 of the cavity resonator antenna 425.

In some embodiments, the cavity resonator antenna 425 may include a slot 430 that may be patterned into (or through) the second conductive layer 420 to form the slot 430. The slot 430 may be substantially similar to the slot 230 described above in FIG. 2. The slot 430 may be implemented into the conductive cavity 427 of the cavity resonator antenna 425 to receive and emit the standing wave(s). Accordingly, in some embodiments, the second conductive layer 420 may be implemented with a sputtering process or the like, whereas the opening of the slot 430 may be implemented with a patterned mask during the sputtering process.

Figure 4F:
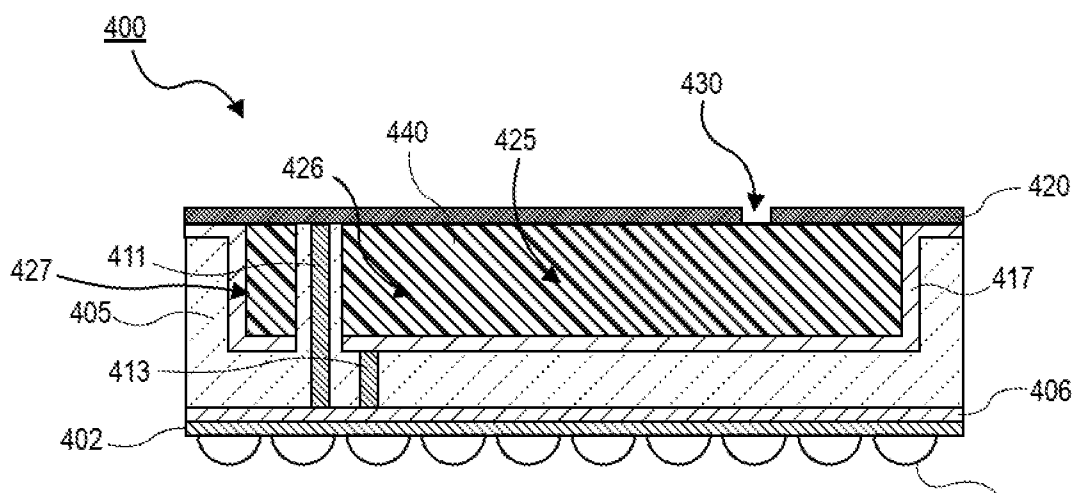

Referring now to FIG. 4F, a cross-sectional illustration of a semiconductor package 400 is shown, in accordance with an embodiment. In an embodiment, the semiconductor package 400 may include a plurality of solder balls 435. The solder balls 435 may be coupled to the substrate 402. Additionally, after the solder balls 435 are disposed, the semiconductor package 400 may be singulated.

Note that the semiconductor package 400 of FIGS. 4A-4F may include fewer or additional or alternative packaging components based on the desired packaging design.

Figure 5:
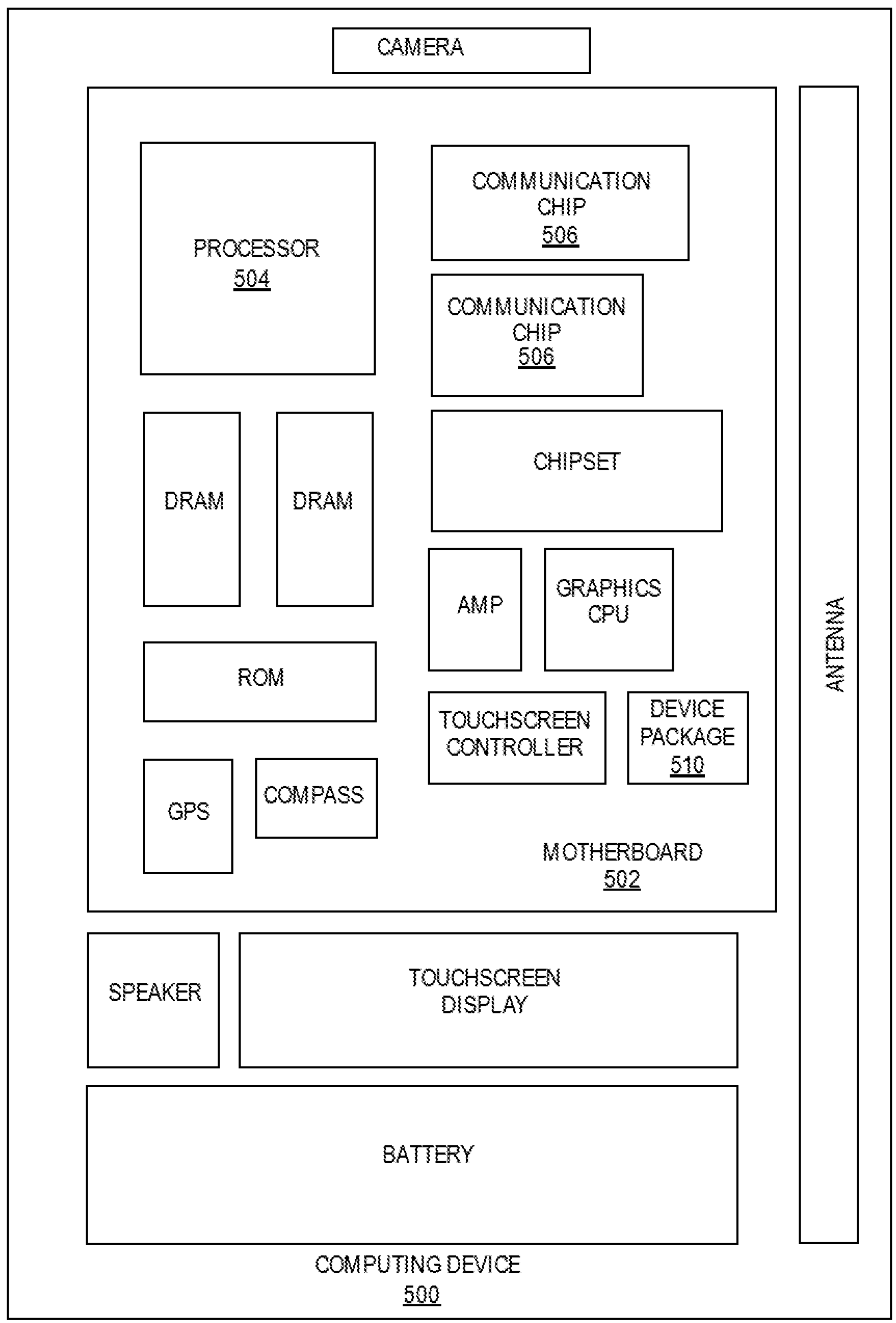
FIG. 5 is an illustration of a schematic block diagram illustrating a computer system that utilizes a device package having one or more cavity resonator antennas, according to one embodiment.

FIG. 5 is an illustration of a schematic block diagram illustrating a computer system 500 that utilizes a device package 510 (or a semiconductor package) with a cavity resonator antenna (and/or a cavity resonator antenna), according to one embodiment. FIG. 5 illustrates an example of computing device 500. Computing device 500 houses motherboard 502. For one embodiment, motherboard 502 may be similar to the substrates 100 and 200 of FIGS. 1-2. Motherboard 502 may include a number of components, including but not limited to processor 504, device package 510, and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a semiconductor package such as a WLCSP, a FCP, a wirebond encapsulated package, or the like as described above. In particular, device package 510 may be a semiconductor package that includes a cavity resonator antenna as described herein, where such antenna may be disposed over a conductive layer, a die (or a bulk silicon layer, etc.), and a substrate as described herein, and where such antenna (or antenna array) may include a plurality of components as described and illustrated in FIGS. 1-4F—or any other components from the figures described herein (i.e., such antenna may include components from FIGS. 1 and 2 and any other embodiments as described herein).

Note that device package 510 may be a single component/device, a subset of components, and/or an entire system, as the materials, features, and components may be limited to device package 510 and/or any other component of the computing device 500 that may need a package integrated cavity resonator antenna as described herein (e.g., the motherboard 502, the processor 504, and/or any other component of the computing device 500 that may need such antennas as described herein).

For certain embodiments, the integrated circuit die may be packaged with one or more devices on a substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a die over a substrate; a first conductive layer over the die; a cavity resonator antenna over the first conductive layer and the substrate, wherein the cavity resonator antenna includes a conductive cavity, a cavity region, and a plurality of interconnects, wherein the conductive cavity is over a top surface of the first conductive layer, and wherein the conductive cavity surrounds the cavity region; and a second conductive layer over the cavity resonator antenna, the first conductive layer, and the substrate, wherein the conductive cavity extends vertically from the first conductive layer to the second conductive layer, and wherein the cavity region is embedded with the conductive cavity, the first conductive layer, and the second conductive layer.

In example 2, the subject matter of example 1 can optionally include that the plurality of interconnects include a plurality of first interconnects, a plurality of second interconnects, and a third interconnect, wherein the plurality of first interconnects include TMVs, a plurality of TSVs, a plurality of conductive sidewalls, or a plurality of conductive trenches, wherein the plurality of first interconnects extend vertically from the first conductive layer to the second conductive layer, wherein the plurality of first interconnects are on the top surface of the first conductive layer, and wherein the plurality of first interconnects surround the cavity region.

In example 3, the subject matter of examples 1-2 can optionally include that an active layer on the substrate, wherein the active layer is between the die and the substrate, and wherein the active layer conductively couples the die to the substrate; an encapsulation layer over and around the cavity resonator antenna, the first conductive layer, the die, the active layer, and the substrate, wherein the encapsulation layer surrounds the plurality of first interconnects, the plurality of second interconnects, and the third interconnect, wherein the encapsulation layer is in the cavity region of the conductive cavity of the cavity resonator antenna; and a plurality of solder balls coupled to the substrate.

In example 4, the subject matter of examples 1-3 can optionally include that the conductive cavity includes a top wall, a bottom wall, and a plurality of sidewalls, wherein the top wall includes a surface of the second conductive layer, wherein the bottom wall includes a surface of the first conductive layer, and wherein the plurality of sidewalls include the plurality of first interconnects.

In example 5, the subject matter of example 1 can optionally include that a plurality of cavity resonator antennas disposed over the top surface of the first conductive layer, wherein the plurality of cavity resonator antennas are coupled to the cavity resonator antenna.

In example 6, the subject matter of examples 1-4 can optionally include that the cavity resonator antenna further includes a slot and a connection point, wherein the slot includes a first opening in the second conductive layer, wherein the slot extends from a first edge of the conductive cavity to a second edge of the conductive cavity that is opposite to the first edge of the conductive cavity, and wherein the first opening of the slot exposes the cavity region of the cavity resonator antenna.

In example 7, the subject matter of examples 1-4 and/or 6 can optionally include that the connection point is surrounded with a second opening in the second conductive layer, wherein the connection point has a first edge and a second edge that is opposite to the first edge, wherein the first edge is positioned over the cavity region, and the second edge is positioned outside the cavity region, and wherein the connection point is conductively coupled to the plurality of second interconnects.

In example 8, the subject matter of example 7 can optionally include that each of the plurality of second interconnects and the third interconnect is a TMV, wherein the plurality of second interconnects include a first signal TMV and a second signal TMV, wherein the third interconnect is a ground TMV, wherein the first signal TMV extends vertically from the first conductive layer to the first edge of the connection point, wherein the second signal TMV extends vertically from the substrate to the second edge of the connection point, wherein the ground TMV is on the substrate and extends vertically from the substrate to the second conductive layer, wherein the ground TMV is positioned outside the cavity region and adjacent to the second edge of the connection point, wherein the plurality of TMVs and the ground TMV are conductively coupled to the second conductive layer, wherein the connection point is substantially coplanar to the slot, and wherein the connection point is positioned perpendicular to the slot.

In example 9, the subject matter of example 8 can optionally include that the plurality of TMVs are tightly positioned on a plurality of outer edges of the top surface of the first conductive layer, wherein the plurality of TMVs are separated with a plurality of gaps, wherein each gap is between two of the plurality of TMVs, wherein the plurality of TMVs have a width that is substantially equal to a width of the plurality of gaps, wherein the first signal TMV has a thickness that is substantially equal to a thickness of the plurality of TMVs, wherein the second signal TMV has a thickness that is substantially equal to a thickness of the ground TMV, and wherein the thickness of the second signal TMV is greater than the thickness of the plurality of TMVs.

Example 10 is a semiconductor package, comprising: a first dielectric layer over an active layer and a substrate, wherein the active layer is on the substrate; a first conductive layer over the first dielectric layer; a cavity resonator antenna over the first conductive layer, the first dielectric layer, and the substrate, wherein the cavity resonator antenna includes a conductive cavity, a cavity region, and a plurality of interconnects, wherein the conductive cavity is over the first dielectric layer, wherein the plurality of interconnects are on the active layer, and wherein the conductive cavity surrounds the cavity region; and a second conductive layer over the cavity resonator antenna, the first conductive layer conductive layer, and the first dielectric layer, wherein the cavity region is embedded with the conductive cavity, the first conductive layer, and the second conductive layer.

In example 11, the subject matter of example 10 can optionally include that the plurality of interconnects include a first interconnect and a second interconnect, wherein the first interconnect extends vertically from the active layer to the second conductive layer, wherein the first interconnect is surrounded with the cavity region, wherein the first dielectric layer is a bulk silicon layer, wherein the first conductive layer has a top surface that is substantially coplanar to a top surface of the first interconnect and a top surface of the first dielectric layer, and wherein the second conductive layer is on the top surfaces of the first conductive layer, the first interconnect, and the first dielectric layer.

In example 12, the subject matter of examples 10-11 can optionally include a second dielectric layer over and around the cavity resonator antenna, the first interconnect, the first dielectric layer, and the first conductive layer, wherein the second dielectric layer surrounds the first interconnect and the first dielectric layer, and wherein the second dielectric layer is in the cavity region of the conductive cavity of the cavity resonator antenna; and a plurality of solder balls coupled to the substrate.

In example 13, the subject matter of examples 10-12 can optionally include that the conductive cavity includes a top wall, a bottom wall, and a plurality of sidewalls, wherein the top wall includes a surface of the second conductive layer, wherein the bottom wall includes a bottom surface of the first conductive layer, wherein the plurality of sidewalls include a surface of the first conductive layer, and wherein the plurality of sidewalls include a plurality of TSVs, a plurality of TMVs, a plurality of conductive sidewalls, or a plurality of conductive trenches.

In example 14, the subject matter of example 10 can optionally include a plurality of cavity resonator antennas disposed over the first conductive layer, the first dielectric layer, and the substrate, wherein the plurality of cavity resonator antennas are coupled to the cavity resonator antenna.

In example 15, the subject matter of examples 10-13 can optionally include that the cavity resonator antenna further includes a slot, wherein the slot includes a first opening in the second conductive layer, wherein the slot extends from a first edge of the conductive cavity to a second edge of the conductive cavity that is opposite to the first edge of the conductive cavity, and wherein the first opening of the slot exposes the cavity region of the cavity resonator antenna.

In example 16, the subject matter of example 15 can optionally include that each of the first interconnect and the second interconnect is a TSV, wherein the first interconnect is a signal TSV, wherein the second interconnect is a ground TSV, wherein the signal TSV extends vertically from the active layer to the second conductive layer point, wherein the bottom wall of the conductive cavity includes a second opening, wherein the signal TSV is embedded vertically within the first dielectric layer, wherein the signal TSV extends vertically through the first dielectric layer, the second dielectric layer, and the second opening of the conductive cavity, wherein the ground TSV extends vertically from the active layer to the first conductive layer, wherein the ground TSV is positioned below the bottom wall of the conductive cavity and adjacent to the signal TSV, wherein the conductive cavity and the ground TSV are conductively coupled to the second conductive layer, and wherein the signal TSV has a thickness that is greater than a thickness of the ground TSV.

Example 17 is a method of forming a semiconductor package, comprising: disposing a die over a substrate; disposing a first conductive layer over a top surface of the die; disposing a conductive cavity over a top surface of the first conductive layer, wherein the conductive cavity surrounds a cavity region; and disposing a second conductive layer over the conductive cavity, the cavity region, the first conductive layer, and the substrate, wherein the conductive cavity extends vertically from the first conductive layer to the second conductive layer, wherein the cavity region is embedded with the conductive cavity, the first conductive layer, and the second conductive layer to form a cavity resonator antenna, wherein the cavity resonator antenna is over the first conductive layer and the substrate, and wherein the cavity resonator antenna includes the conductive cavity, the cavity region, and a plurality of interconnects.

In example 18, the subject matter of example 17 can optionally include that the plurality of interconnects include a plurality of first interconnects, a plurality of second interconnects, and a third interconnect, wherein the plurality of first interconnects include a plurality of TMVs, a plurality of TSVs, a plurality of conductive sidewalls, or a plurality of conductive trenches, wherein the plurality of first interconnects extend vertically from the first conductive layer to the second conductive layer, wherein the plurality of first interconnects are on the top surface of the first conductive layer, and wherein the plurality of first interconnects surround the cavity region.

In example 19, the subject matter of examples 17-18 can optionally include disposing an active layer on the substrate, wherein the active layer is between the die and the substrate, and wherein the active layer conductively couples the die to the substrate; disposing an encapsulation layer over and around the cavity resonator antenna, the first conductive layer, the die, the active layer, and the substrate, wherein the encapsulation layer surrounds the plurality of first interconnects, the plurality of second interconnects, and the third interconnect, wherein the encapsulation layer is in the cavity region of the conductive cavity of the cavity resonator antenna; and disposing a plurality of solder balls coupled to the substrate.

In example 20, the subject matter of examples 17-18 can optionally include that the conductive cavity includes a top wall, a bottom wall, and a plurality of sidewalls, wherein the top wall includes a surface of the second conductive layer, wherein the bottom wall includes a surface of the first conductive layer, and wherein the plurality of sidewalls include the plurality of first interconnects.

In example 21, the subject matter of example 17 can optionally include disposing a plurality of cavity resonator antennas over the top surface of the first conductive layer, wherein the plurality of cavity resonator antennas are coupled to the cavity resonator antenna.

In example 22, the subject matter of example 20 can optionally include that the cavity resonator antenna further includes a slot and a connection point, wherein the slot includes a first opening in the second conductive layer, wherein the slot extends from a first edge of the conductive cavity to a second edge of the conductive cavity that is opposite to the first edge of the conductive cavity, and wherein the first opening of the slot exposes the cavity region of the cavity resonator antenna.

In example 23, the subject matter of example 22 can optionally include that the connection point is surrounded with a second opening in the second conductive layer, wherein the connection point has a first edge and a second edge that is opposite to the first edge, wherein the first edge is positioned over the cavity region, and the second edge is positioned outside the cavity region, and wherein the connection point is conductively coupled to the plurality of second interconnects.

In example 24, the subject matter of example 23 can optionally include that each of the plurality of second interconnects and the third interconnect is a TMV, wherein the plurality of second interconnects include a first signal TMV and a second signal TMV, wherein the third interconnect is a ground TMV, wherein the first signal TMV extends vertically from the first conductive layer to the first edge of the connection point, wherein the second signal TMV extends vertically from the substrate to the second edge of the connection point, wherein the ground TMV is on the substrate and extends vertically from the substrate to the second conductive layer, wherein the ground TMV is positioned outside the cavity region and adjacent to the second edge of the connection point, wherein the plurality of TMVs and the ground TMV are conductively coupled to the second conductive layer, wherein the connection point is substantially coplanar to the slot, and wherein the connection point is positioned perpendicular to the slot.

In example 25, the subject matter of examples 17-18 can optionally include that the plurality of TMVs are tightly positioned on a plurality of outer edges of the top surface of the first conductive layer, wherein the plurality of TMVs are separated with a plurality of gaps, wherein each gap is between two of the plurality of TMVs, wherein the plurality of TMVs have a width that is substantially equal to a width of the plurality of gaps, wherein the first signal TMV has a thickness that is substantially equal to a thickness of the plurality of TMVs, wherein the second signal TMV has a thickness that is substantially equal to a thickness of the ground TMV, and wherein the thickness of the second signal TMV is greater than the thickness of the plurality of TMVs.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:

a die over a substrate;

a first conductive layer over the die;

a cavity resonator antenna over the first conductive layer and the substrate, wherein the cavity resonator antenna includes a conductive cavity, a cavity region, and a plurality of interconnects, wherein the conductive cavity is over a top surface of the first conductive layer, and wherein the conductive cavity surrounds the cavity region;

a second conductive layer over the cavity resonator antenna, the first conductive layer, and the substrate, wherein the conductive cavity extends vertically from the first conductive layer to the second conductive layer, and wherein the cavity region is embedded with the conductive cavity, the first conductive layer, and the second conductive layer; and an encapsulation layer laterally adjacent to the die and laterally adjacent to the cavity resonator antenna, wherein the second conductive layer is on a top surface of the encapsulation layer.

2. The semiconductor package of claim 1, wherein the plurality of interconnects include a plurality of first interconnects, a plurality of second interconnects, and a third interconnect, wherein the plurality of first interconnects include a plurality of through-mold vias (TMVs), a plurality of through-silicon vias (TSVs), a plurality of conductive sidewalls, or a plurality of conductive trenches, wherein the plurality of first interconnects extend vertically from the first conductive layer to the second conductive layer, wherein the plurality of first interconnects are on the top surface of the first conductive layer, and wherein the plurality of first interconnects surround the cavity region.

3. The semiconductor package of claim 2, further comprising:

an active layer on the substrate, wherein the active layer is between the die and the substrate, and wherein the active layer conductively couples the die to the substrate;

wherein the encapsulation layer surrounds the plurality of first interconnects, the plurality of second interconnects, and the third interconnect, and wherein the encapsulation layer is in the cavity region of the conductive cavity of the cavity resonator antenna; and a plurality of solder balls coupled to the substrate.

4. The semiconductor package of claim 3, wherein the conductive cavity includes a top wall, a bottom wall, and a plurality of sidewalls, wherein the top wall includes a surface of the second conductive layer, wherein the bottom wall includes a surface of the first conductive layer, and wherein the plurality of sidewalls include the plurality of first interconnects.

5. The semiconductor package of claim 4, wherein the cavity resonator antenna further includes a slot and a connection point, wherein the slot includes a first opening in the second conductive layer, wherein the slot extends from a first edge of the conductive cavity to a second edge of the conductive cavity that is opposite to the first edge of the conductive cavity, and wherein the first opening of the slot exposes the cavity region of the cavity resonator antenna.

6. The semiconductor package of claim 5, wherein the connection point is surrounded with a second opening in the second conductive layer, wherein the connection point has a first edge and a second edge that is opposite to the first edge, wherein the first edge is positioned over the cavity region, and the second edge is positioned outside the cavity region, and wherein the connection point is conductively coupled to the plurality of second interconnects.

7. The semiconductor package of claim 6, wherein each of the plurality of second interconnects and the third interconnect is a TMV, wherein the plurality of second interconnects include a first signal TMV and a second signal TMV, wherein the third interconnect is a ground TMV, wherein the first signal TMV extends vertically from the first conductive layer to the first edge of the connection point, wherein the second signal TMV extends vertically from the substrate to the second edge of the connection point, wherein the ground TMV is on the substrate and extends vertically from the substrate to the second conductive layer, wherein the ground TMV is positioned outside the cavity region and adjacent to the second edge of the connection point, wherein the plurality of first interconnects and the ground TMV are conductively coupled to the second conductive layer, wherein the connection point is substantially coplanar to the slot, and wherein the connection point is positioned perpendicular to the slot.

8. The semiconductor package of claim 7, wherein, when the plurality of first interconnects include the plurality of TMVs, the plurality of TMVs are tightly positioned on a plurality of outer edges of the top surface of the first conductive layer, wherein, when the plurality of first interconnects include the plurality of TMVs, the plurality of TMVs are separated with a plurality of gaps, wherein, when the plurality of first interconnects include the plurality of TMVs, each gap is between two of the plurality of TMVs, wherein, when the plurality of first interconnects include the plurality of TMVs, the plurality of TMVs have a width that is substantially equal to a width of the plurality of gaps, wherein, when the plurality of first interconnects include the plurality of TMVs, the first signal TMV has a thickness that is substantially equal to a thickness of the plurality of TMVs, wherein the second signal TMV has a thickness that is substantially equal to a thickness of the ground TMV, and wherein, when the plurality of first interconnects include the plurality of TMVs, the thickness of the second signal TMV is greater than the thickness of the plurality of TMVs.

9. The semiconductor package of claim 1, further comprising a plurality of cavity resonator antennas disposed over the top surface of the first conductive layer, wherein the plurality of cavity resonator antennas are coupled to the cavity resonator antenna.

10. A semiconductor package, comprising:

a first dielectric layer over an active layer and a substrate, wherein the active layer is on the substrate;

a first conductive layer over the first dielectric layer;

a cavity resonator antenna over the first conductive layer, the first dielectric layer, and the substrate, wherein the cavity resonator antenna includes a conductive cavity, a cavity region, and a plurality of interconnects, wherein the conductive cavity is over the first dielectric layer, wherein the plurality of interconnects are on the active layer, and wherein the conductive cavity surrounds the cavity region;

a second conductive layer over the cavity resonator antenna, the first conductive layer, conductive layer, and the first dielectric layer, wherein the cavity region is embedded with the the first conductive layer, and the second conductive layer; and an encapsulation layer laterally adjacent to the active layer and laterally adjacent to the cavity resonator antenna, wherein the second conductive layer is on a top surface of the encapsulation layer.

11. The semiconductor package of claim 10, wherein the plurality of interconnects include a first interconnect and a second interconnect, wherein the first interconnect extends vertically from the active layer to the second conductive layer, wherein the first interconnect is surrounded with the cavity region, wherein the first dielectric layer is a bulk silicon layer, wherein the first conductive layer has a top surface that is substantially coplanar to a top surface of the first interconnect and a top surface of the first dielectric layer, and wherein the second conductive layer is over the top surfaces of the first conductive layer, the first interconnect, and the first dielectric layer.

12. The semiconductor package of claim 11, further comprising:

a second dielectric layer over and around the cavity resonator antenna, the first interconnect, the first dielectric layer, and the first conductive layer, wherein the second dielectric layer surrounds the first interconnect and the first dielectric layer, and wherein the second dielectric layer is in the cavity region of the conductive cavity of the cavity resonator antenna; and a plurality of solder balls coupled to the substrate.

13. The semiconductor package of claim 12, wherein the conductive cavity includes a top wall, a bottom wall, and a plurality of sidewalls, wherein the top wall includes a surface of the second conductive layer, wherein the bottom wall includes a bottom surface of the first conductive layer, wherein the plurality of sidewalls include a surface of the first conductive layer, and wherein the plurality of sidewalls include a plurality of TSVs, a plurality of TMVs, a plurality of conductive sidewalls, or a plurality of conductive trenches.

14. The semiconductor package of claim 13, wherein the cavity resonator antenna further includes a slot, wherein the slot includes a first opening in the second conductive layer, wherein the slot extends from a first edge of the conductive cavity to a second edge of the conductive cavity that is opposite to the first edge of the conductive cavity, and wherein the first opening of the slot exposes the cavity region of the cavity resonator antenna.

15. The semiconductor package of claim 14, wherein each of the first interconnect and the second interconnect is a TSV, wherein the first interconnect is a signal TSV, wherein the second interconnect is a ground TSV, wherein the signal TSV extends vertically from the active layer to the second conductive layer, wherein the bottom wall of the conductive cavity includes a second opening, wherein the signal TSV is embedded vertically within the first dielectric layer, wherein the signal TSV extends vertically through the first dielectric layer, the second dielectric layer, and the second opening of the conductive cavity, wherein the ground TSV extends vertically from the active layer to the first conductive layer, wherein the ground TSV is positioned below the bottom wall of the conductive cavity and adjacent to the signal TSV, wherein the conductive cavity and the ground TSV are conductively coupled to the second conductive layer, and wherein the signal TSV has a thickness that is greater than a thickness of the ground TSV.

16. The semiconductor package of claim 10, further comprising a plurality of cavity resonator antennas disposed over the first conductive layer, the first dielectric layer, and the substrate, wherein the plurality of cavity resonator antennas are coupled to the cavity resonator antenna.

* * * * *